US012368452B2

(12) United States Patent
Ruehle

(10) Patent No.: US 12,368,452 B2
(45) Date of Patent: Jul. 22, 2025

(54) CONTROL SYSTEM, CONTROL METHOD AND QUANTUM COMPUTER SYSTEM

(71) Applicant: Rohde & Schwarz GmbH & Co. KG, Munich (DE)

(72) Inventor: Christoph Ruehle, Karlsruhe (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 258 days.

(21) Appl. No.: 18/314,373

(22) Filed: May 9, 2023

(65) Prior Publication Data

US 2024/0380412 A1    Nov. 14, 2024

(51) Int. Cl.
| | |
|---|---|
| *H03M 1/66* | (2006.01) |
| *G06N 10/20* | (2022.01) |
| *G06N 10/00* | (2022.01) |
| *G06N 10/40* | (2022.01) |

(52) U.S. Cl.
CPC .............. *H03M 1/66* (2013.01); *G06N 10/20* (2022.01); *G06N 10/00* (2019.01); *G06N 10/40* (2022.01)

(58) Field of Classification Search
CPC ......... H03M 1/66; G06N 10/00; G06N 10/20; G06N 10/40
See application file for complete search history.

(56) References Cited

U.S. PATENT DOCUMENTS 11,238,360 B2    2/2022   Bishop et al.

FOREIGN PATENT DOCUMENTS

DE    112013006010 T5 *  8/2015   ............. H03K 17/92

* cited by examiner

*Primary Examiner* — Joseph J Lauture
(74) *Attorney, Agent, or Firm* — Patterson + Sheridan, LLP

(57) ABSTRACT

The present disclosure provides a control system comprising at least one measurement signal path configured to measure a state of at least one respective qubit, a digital signal generation signal path for each qubit, wherein the signal generation signal path is configured to generate at least one digital control signal for the respective qubit, in each digital signal generation signal path, a digital switch for each digital control signal, wherein the digital switch is configured to controllably pass through the respective digital control signal to an output of the digital signal generation signal path or to block the respective digital control signal based on the measured state of the respective qubit, and an analog signal path for each digital signal generation signal path, wherein the analog signal path is coupled to the output of the respective digital signal generation signal path and configured to generate an analog control pulse waveform for the respective qubit based on the at least one digital control signal. The present disclosure further provides a control method, and a quantum computer system.

24 Claims, 9 Drawing Sheets

CONTROL SYSTEM, CONTROL METHOD AND QUANTUM COMPUTER SYSTEM

TECHNICAL FIELD

The disclosure relates to a control system, to a control method, and to a quantum computer system.

BACKGROUND

Although applicable to any type of control device, the present disclosure will mainly be described in conjunction with control devices for controlling quantum qubits.

In modern quantum computers, single qubits (quantum bits), are used to represent basic units of quantum information. However, all currently known qubit implementations lose their quantum state over time. Depending on the implementation of the qubit, the qubit may lose its state in a timescales of microseconds to a few seconds.

Consequently, in cases in which the qubit state is determined and conditionally controls the generation of subsequent pulse sequences, the latency between qubit state determination and generating a conditional pulse sequence shall be minimized to prevent an intermediate state information loss.

Accordingly, there is a need for improving control of quantum computers.

SUMMARY

The above stated problem is solved by the features of the independent claims. It is understood, that independent claims of a claim category may be formed in analogy to the dependent claims of another claim category.

Accordingly, it is provided:

A control system comprising at least one measurement signal path configured to measure a state of at least one respective qubit i.e., one, two, three or more qubits, a digital signal generation signal path for each measurement signal path, or each qubit where a single measurement signal path measures the states of more than one qubit, wherein the signal generation signal path is configured to generate at least one digital control signal for the respective qubit, in each digital signal generation signal path, a digital switch for each digital control signal, wherein the digital switch is configured to controllably pass through the respective digital control signal to an output of the digital signal generation signal path or to block the respective digital control signal based on the measured state of the respective qubit, and an analog signal path for each digital signal generation signal path, wherein the analog signal path is coupled to the output of the respective digital signal generation signal path and configured to generate an analog control pulse waveform for the respective qubit based on the at least one digital control signal.

Further, it is provided:

A control method comprising measuring a state of at least one qubit, generating at least one digital control signal for each qubit, controllably passing through the respective digital control signals, or blocking the generated digital control signals based on the measured states of the respective qubit, and generating an analog control pulse waveform for each one of the qubits based on the at least one digital control signal when it is passed through.

Further, it is provided:

A quantum computer system comprising at least one qubit, and a control system comprising a measurement signal path for at least one of the qubits i.e., one, two, three or more qubits, configured to measure a state of the respective qubit, a digital signal generation signal path for each measurement signal path, or each qubit where a single measurement signal path measures the states of more than one qubit, wherein the signal generation signal path is configured to generate at least one digital control signal for the respective qubit, in each digital signal generation signal path, a digital switch for each digital control signal, wherein the digital switch is configured to controllably pass through the respective digital control signal to an output of the digital signal generation signal path or to block the respective digital control signal based on the measured state of the respective qubit, and an analog signal path for each digital signal generation signal path, wherein the analog signal path is coupled to the output of the respective digital signal generation signal path and configured to generate an analog control pulse waveform for the respective qubit based on the at least one digital control signal.

The present disclosure is based on the finding that providing a low latency control system for controlling qubits requires to reduce the delay in the feedback control system of the qubits.

In the present disclosure, the term qubit is generally used to describe quantum systems that may represent quantum states. While the term qubit may be used for quantum systems that use two states or two levels, in the context of the present disclosure, the term qubit is not limited to two-state or two-level quantum systems. Instead, the term qubit is to be understood as or may be replaced with any other quantum system, like a qutrit or quantum trit.

During operation of a qubit or multiple qubits in a quantum computer, the single qubits need to be controlled to operate as expected. Qubit implementations, like the transmon qubits, may be controlled by sending respective control pulse waveforms to the qubit. The control pulse waveforms may control the respective qubit to behave in a certain way. The control pulse waveforms may also be called gate pulses, like the H, X, Y, Z, T, or CNOT gate pulses. Such gate pulses perform a specific operation on the qubit, which are not discussed in further detail here, wherein reference is made to general descriptions of qubit gate functions. Although the transmon qubit implementation is explicitly mentioned here, it is understood, that the present disclosure is not limit to transmon qubit implementations and may be applied to any other technical qubit implementation that requires feedback-based control systems.

Generally, quantum feedback control is a class of methods to control qubit states of qubits in a quantum computer system towards a desired outcome. Feedback occurs or is generated when measurements of the system are used as inputs that control the generation of control pulse waveforms that control the qubits in the quantum computer system.

Further, qubits may need to be initialized to a predefined state prior to performing operations e.g., with the H, X, Y, Z, T, or CNOT gate pulses, on the respective qubit.

The goal of qubit initialization is to prepare a qubit in a known state, such that all the subsequent operations are performed from a known starting point. At the beginning, the qubit is usually in a random state. Therefore, a first measurement of the qubit state is performed. After that first measurement, the qubit will be in one of its two eigenstates, either $|g\rangle$ (ground) or $|e\rangle$ (excited). If the required target state is measured, no further initialization of the qubit is required and further functions may be executed with the qubit.

In case that the unwanted state is measured, the control system will apply a reset pulse to correct the qubit state to the desired value prior to performing the required functions with the qubit.

Depending on the specific qubit implementation, a second excited state e.g., called |f> state, may also be thermally populated in some cases in such a qubit. To reset the qubit from the |f> state, two reset pulses or control pulse waveforms are sequentially provided to the qubit. The first control pulse waveform initiates the qubit to transition from the |f> state to the |e> state, and the second control pulse waveform initiates the qubit to transition from the |e> state to the |g> state.

Resetting the qubit i.e., correcting the state of the qubit, should happen as quickly as possible, otherwise the qubit might change its state due to noise or decay, decreasing the initialization fidelity. Therefore, the latency is a key parameter in qubit control.

Furthermore, applications like quantum teleportation or quantum phase estimation using dynamic circuits also benefit from a reduced measurement feedback latency.

Current solutions for controlling qubits usually involve FPGAs, in which a sequencer of an arbitrary waveform generator (AWG) controls the playback of control pulse waveforms that are stored in a waveform memory. The AWG's behavior is controlled by its sequence program stored in an instruction memory, which it executes like a traditional computer CPU. The control pulse waveforms are converted into analog waveforms in the AWG and output to the qubit as control signals.

For cases that require a feedback-based control, the AWG sequencer usually provides the control pulse waveforms to a digital-to-analog converter, DAC, in the AWG. The DAC then converts the data stream to qubit control pulses.

However, the signal chain in the AWG i.e., from AWG sequencer through the DAC may introduce an important amount of signal delay which adds up to overall feedback control latency.

As indicated above, currently known qubit implementations lose their quantum state over time in a timescales of microseconds to few seconds. The control system, therefore, should execute feedback-based operations with as small delays as possible to avoid qubit decay during the delay time.

Quantum control systems may comprise DACs that may play the RF pulses at sampling rates ranging from 1 GS/s to several tens of GS/s to control qubits. Many of the commercially available DACs at these sampling rates introduce large signal delays due to their interfacing to digital data sources e.g., using the JESD204B protocol, and their internal signal processing chain. The signal sources may comprise FPGAs that implement AWG sequencers and may also introduce a certain amount of delay when generating the digital signal stream for the required control pulse waveforms. Furthermore, digital and analog signal processing in the signal chain may cause additional signal delay. Such delays add to the quantum feedback latency and thus decrease the fidelity of quantum feedback operations.

The present disclosure, therefore, provides a control system and control method that hide a large amount of the delay caused by the control signal chain that generates the control pulse waveforms, and thus allows lower feedback control latencies.

To this end, the present disclosure provides the control system for controlling a qubit with feedback-based control pulse waveforms. This means, that the control pulse waveforms may be generated based on a feedback that is generated based on a measurement of the respective qubit state. Such a control may also be called closed-loop (quantum) control, feedback-based (quantum) control or (quantum) feedback control.

The control system according to the present disclosure comprises a measurement signal path that serves for measuring the state of a qubit. Above it is already mentioned that the present disclosure may be applied to any technical implementation of a qubit that requires control pulse waveforms for operation. Consequently, the measurement signal path may comprise at least one of any adequate analog circuitry or any adequate digital circuitry that is required to measure the state of the respective qubit and to generate a feedback signal in the control system. It is understood, that such a feedback signal may be an analog feedback signal or a digital feedback signal.

In the case of transmon qubits being used, the state of the qubits is usually measured dispersively. This means that a probe signal that is applied to an auxiliary linear resonator that is coupled to the qubit acquires a phase shift that depends on the qubit's quantum state. An exemplary measurement signal path may consequently comprise such an auxiliary resonator, the signal generator that is required to generate the probe signal, and a measurement circuitry or apparatus that measures the probe signal after acquiring the state-dependent phase shift. The measurement circuitry or apparatus may then output an analog signal that represents the phase shift and, therefore, the qubit state, or a digital information about the state of the qubit.

In the control system, a measurement signal path will be assigned to or provided for each qubit that is to be controlled. In embodiments, a single measurement path may be used to measure the states of multiple qubits. In such cases, a kind of multiplexing may be implemented e.g., by at least one of switching on/off single qubits to the measurement path, or by using different read-out frequencies for each qubit.

The control system further comprises a digital signal generation signal path for each qubit or measurement signal path. Each one of the digital signal generation signal paths generates at least one digital control signal for the respective qubit. In embodiments, measurement results of two different qubits may be used to conditionally control pulse sequences on a third qubit, as e.g., in quantum teleportation experiments. This means, that the measurement result of one or multiple measurement paths may also be provided to one or multiple digital signal generation signal paths, wherein the receiving digital signal generation signal paths may be coupled to different qubits than the measurement signal paths.

In each one of the digital signal generation signal paths, a digital switch is provided. The digital switch serves for either passing-through the respective digital control signal or blocking or blanking-out the respective digital control signal based on the measured state of the respective qubit. In case that only one digital control signal is generated, the digital signal generation signal path comprises one switch for this digital signal generation signal path.

Further, the analog signal path is provided that receives the at least one digital control signal and generates respective analog control pulse waveforms.

Of course, when multiple digital control signals are generated, the qubit is not provided with multiple different control pulse waveforms at the same time. Instead, in embodiments, the generated digital control signals are either combined into one digital control signal or are provided sequentially to the analog signal path. In embodiments, the analog signal path may comprise a combiner or mixer that combines multiple concurrent control pulse waveforms into a single control pulse waveform.

With the control system according to the present disclosure, one or multiple digital control signals may be generated in advance e.g., before the measurement result of the state measurement of the respective qubit is available.

The only timing requirement is that the control of the respective switch needs to be performed, when or just before the respective digital control signal arrives at the switch.

For example, when resetting a qubit, the digital control signal for a control pulse waveform for resetting the qubit from the |e> state to the |g> state may be generated prior to receiving the measurement result in the control system. A control signal for the respective switch may then be generated based on the measured qubit state, such that the digital control signal is either passed-through to the analog signal path, if the qubit is not in the |g> state, or blocked, if the qubit is already in the |g> state.

If the qubit implementation allows the qubit to be in the |f> state, two digital control signals may be generated prior to receiving the measurement result in the control system. A first digital control signal for a control pulse waveform that transitions the qubit from the |f> state to the |e> state, and a second digital control signal for a control pulse waveform that transitions the qubit from the |e> state to the |g> state.

Of course, both digital control signals may be generated in parallel, wherein at least the second digital control signal may be generated consecutively two times. This allows passing through either the first implementation of the second digital control signal, if the qubit is measured to be in the |e> state, or passing through the first digital control signal first, and then the second implementation of the second control signal, if the qubit is measured to be in the |f> state.

Consequently, with the present disclosure, the delay during an active qubit reset may be reduced i.e., the "reset latency" between the end of the measurement of the qubit state and the required control pulse waveforms being played to reset a qubit to the desired state is reduced, thus greatly improving the fidelity of the qubit reset.

Further, during general feedback-based qubit control the delay between an event, which may in exemplary embodiments comprise a qubit measurement, an external trigger pulse, or the combined result of multiple qubit measurements, and the control pulse waveforms that depend on this event being played may be significantly reduced. The solution according to the present disclosure, consequently, saves experiment execution time, and as for the active qubit reset, greatly reduces the time during which a qubit state might decay.

Further embodiments of the present disclosure are subject of the further dependent claims and of the following description, referring to the drawings.

In the following, the dependent claims referring directly or indirectly to claim 1 are described in more detail. For the avoidance of doubt, the features of the dependent claims relating to the control system can be combined in all variations with each other and the disclosure of the description is not limited to the claim dependencies as specified in the claim set. Further, the features of the other independent claims relating to the method and the quantum computer system may be combined with any of the features of the dependent claims relating to the control system in all variations, wherein in the apparatus elements may be replaced by respective method steps in the method.

In an embodiment, which can be combined with all other embodiments of the control system mentioned above or below, the control system may comprise at least one measurement evaluation logic that is coupled to a respective one of the measurement signal paths, and that is configured to evaluate the measurement result, and to generate a respective switch control signal, and to provide the generated switch control signal to the switches of the respective digital signal generation signal path.

The switch control signals for the single switches are generated to directly control the digital switches in the digital signal generation signal paths. Therefore, in contrast to initiating e.g., the AWG sequencer, based on the measurement results, the signal generation and processing chain until the digital switches is bypassed and the switch control signals are provided directly to the respective switches.

This allows starting the generation of the digital control signals in the digital signal generation signal path already before the measurement results are available, and providing the digital control signals as soon as possible to the digital switches.

As explained above, different technical implementations of qubits are possible. The measurement evaluation logic may, consequently, be adapted to evaluate a measurement signal from the chosen qubit implementation. In case of a transmon qubit, the measurement evaluation logic may be enabled to analyze the probe signal, especially the phase shift of the probe signal, with respective measurement circuitry or measurement devices.

In another embodiment, which can be combined with all other embodiments of the control system mentioned above or below, the control system may comprise a synchronization logic configured to synchronize the operation of at least two of a respective measurement signal path, the respective digital signal generation signal path, and the respective analog signal.

In embodiments, the control system may comprise a synchronization or timing logic that may synchronize the operation of the single elements of the respective measurement signal path, the respective digital signal generation signal path, and the respective analog signal path such that each signal in the control system is generated and/or arrives at the required element at the right moment in time. Such a synchronization or timing logic may comprise at least one of a digital controller, a CPU, a state machine, a CPLD, an FPGA or the like to implement the control functions.

In a further embodiment, which can be combined with all other embodiments of the control system mentioned above or below, at least one digital signal generation signal path is configured to generate at least two digital control signals, wherein the at least two digital control signals are generated at least one of sequentially or in parallel.

In a single digital signal generation signal path multiple digital control signals will usually be generated sequentially. In the control system according to the present disclosure, this is, of course, also possible. The respective digital switch may then be controlled to selectively pass through the required ones of the sequentially generated digital control signals.

For example, two sequentially generated control signals may comprise e.g., one for generating a control pulse waveform that transitions the qubit from the |f> state to the |e> state, and another one for generating a control pulse waveform that transitions the qubit from the |e> state to the |g> state.

In case that the qubit is measured to be in the |e> state, the first one of the digital control signals may be blocked. In case that the qubit is measured to be in the |g> state both digital control signals may be blocked. In case that the qubit is measured to be in the |f> state, no one of the two sequentially generated control signals is blocked, in order to reset the qubit.

In embodiments, in a single digital signal generation signal path, multiple digital control signals may be generated in parallel. In such embodiments, single digital control signals may be blocked, such that a single one of the parallel digital control signals is passed through.

This allows further speeding up the control of the qubit in case that a single one of the digital control signals is optional. For example, in the case of resetting a qubit, three digital control signals may be generated in parallel.

A first digital control signal may comprise the digital control signal for generating a control pulse waveform that transitions the qubit from the |e> state to the |g> state. A second digital control signal may comprise two consecutive digital control signals, one for generating a control pulse waveform that transitions the qubit from the |f> state to the |e> state, and another one for generating a control pulse waveform that transitions the qubit from the |e> state to the |g> state. The third digital control signal may be generated with a digital control signal for generating a control pulse waveform that performs a required function on the qubit.

In such an embodiment, if the qubit is measured to be in the |e> state, the second, and the third digital control signals may be blocked. While the qubit is reset based on the first digital control signal, the generation of the third digital control signal may be restarted to perform any required function with the qubit after it is reset e.g., to perform calculations of a respective algorithm that is executed in the respective quantum system or quantum computer.

In case that the qubit is measured to be in the |f> state, the first, and the third digital control signals may be blocked. Again, while the qubit is reset based on the second digital control signal, the generation of the third digital control signal may be restarted to perform any required function with the qubit after it is reset e.g., to perform calculations of a respective algorithm that is executed in the respective quantum system or quantum computer.

In another case, if the qubit is measured to be in the |g> state, the first, and the second digital control signals may be blocked. The third digital control signal may then directly be used to perform any required function with the qubit e.g., to perform calculations of a respective algorithm that is executed in the respective quantum system or quantum computer.

In a further embodiment, which can be combined with all other embodiments of the control system mentioned above or below, each digital signal generation signal path may comprise a digital data stream source for each digital control signal, and each digital data stream source may be coupled to the respective digital switch directly, or via a serial data interface, or via a parallel data interface, wherein outputs of all digital switches of each digital signal generation signal path may be couple to the respective analog signal path, and wherein each analog signal path may comprise converter circuitry configured to convert the received digital control signals into respective control pulse waveforms.

The digital data stream source may be any type of source that may provide a digital data stream that represents the respective control pulse waveform. Such a digital data stream source may comprise a memory and a respective logic to read out and forward respective digital data from the memory.

In embodiments in which the digital data stream source and the switches are provided in a single device, the switches may be coupled directly to the digital data stream source. In other embodiments, the digital data stream source and the switches may be provided in different devices. In such cases, a digital data interface, like a parallel or a serial data interface, may be used to provide the data from the digital data stream source to the switches.

The analog signal paths receive the respective digital control signals and convert them into the control pulse waveforms with the converter circuitry. The analog signal paths, therefore, are not purely analog but, in embodiments, also perform the conversion of the digital control signals to analog signals. In embodiments, after converting the digital control signals into analog signals, further analog signal processing may be applied to generate the final control pulse waveforms.

In another embodiment, which can be combined with all other embodiments of the control system mentioned above or below, each digital signal generation signal path may comprise an arbitrary waveform generator sequencer as digital data stream source that is coupled to the digital input interface of a respective digital-to-analog converter, and the respective digital switch and the converter circuitry may be provided in the digital-to-analog converter, and the digital switch may be provided between the digital input interface and the converter circuitry.

An arbitrary waveform generator, AWG, is a device that generates analog waveforms from digitally stored data that represents the respective waveforms. In embodiments of the control system, an AWG may be used to implement at least part of the digital signal generation signal path, and part of the analog signal path.

For example, the AWG sequencer may be provided as or as part of the digital data stream source. Such an AWG sequencer may e.g., be implemented in an FPGA, as a respective configuration of the FPGA.

Further, the digital-to-analog converter, DAC, may also be part of the AWG and may be coupled to the AWG sequencer via a digital data interface, for example a serial JESD204B or JESD204C interface. In embodiments, that comprise an FPGA-based AWG sequencer, the FPGA may comprise the respective interface.

It is understood, that the digital switch may be provided at the latest possible position in the signal chain of the DAC i.e., right before the element that converts the digital signal into an analog signal. Prior to the digital switch in the signal chain of the DAC e.g., the interface circuitry, and further signal processing circuitry may be present.

In such embodiments, components may be used to implement the control system according to the present disclosure that may be readily available and only require little modification, like including the digital switch in the DAC or modifying a switch or the (external) control of a switch that may already be present in the DAC.

In another embodiment, which can be combined with all other embodiments of the control system mentioned above or below, the control system may comprise in at least one of the digital signal generation signal paths at least two digital data stream sources, each with a respective switch, and a respective converter circuitry.

This allows easily generating two different control pulse waveforms for a single qubit, with standard elements, like digital-to-analog converters that each comprise a single input interface e.g., a JESD204B or JESD204C interface, possible already equipped with a respective digital switch.

A signal combiner may be provided after the converter circuitry, especially external to the at least two digital-to-analog converters.

In a further embodiment, which can be combined with all other embodiments of the control system mentioned above or below, the at least one digital control signal may comprise at least one of a digital control signal for a control pulse waveform that transitions the qubit from the |e> state to the |g> state, a digital control signal for a control pulse waveform that transitions the qubit from the |f> state to the |e> state, a digital control signal for a control pulse waveform that performs the function of an X gate on the qubit, a digital control signal for a control pulse waveform that performs the function of a Y gate on the qubit, a digital control signal for a control pulse waveform that performs the function of a Z gate on the qubit, a digital control signal for a control pulse waveform that performs the function of a CZ gate on the qubit, a digital control signal for a control pulse waveform that performs the function of an H gate on the qubit, a digital control signal for a control pulse waveform that performs the function of a CNOT gate on the qubit, a digital control signal for a control pulse waveform that performs the function of an S gate on the qubit, and a digital control signal for a control pulse waveform that performs the function of a T gate on the qubit.

The digital control signal comprising a "digital control signal for a control pulse waveform that performs . . . " in this context refers to the digital control signal comprising information that when processed in the digital signal generation signal path and the analog signal path results in a control pulse waveform that when applied to a qubit causes the respective function to be performed in or by the qubit.

Above, the exemplary sequence of digital control signals, and control pulse waveforms is explained mostly with relation to resetting a qubit. Of course, in embodiments, the application of the present disclosure is not limited to resetting a qubit, but may be applied to any arbitrary sequence of control pulse waveforms that may, for example, form part of a quantum algorithm that is executed in a quantum system or quantum computer.

In such use cases, single digital control signals may be blocked or passed based on measurements on the qubit, or based on a fixed timing, by controlling the respective digital switches accordingly.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
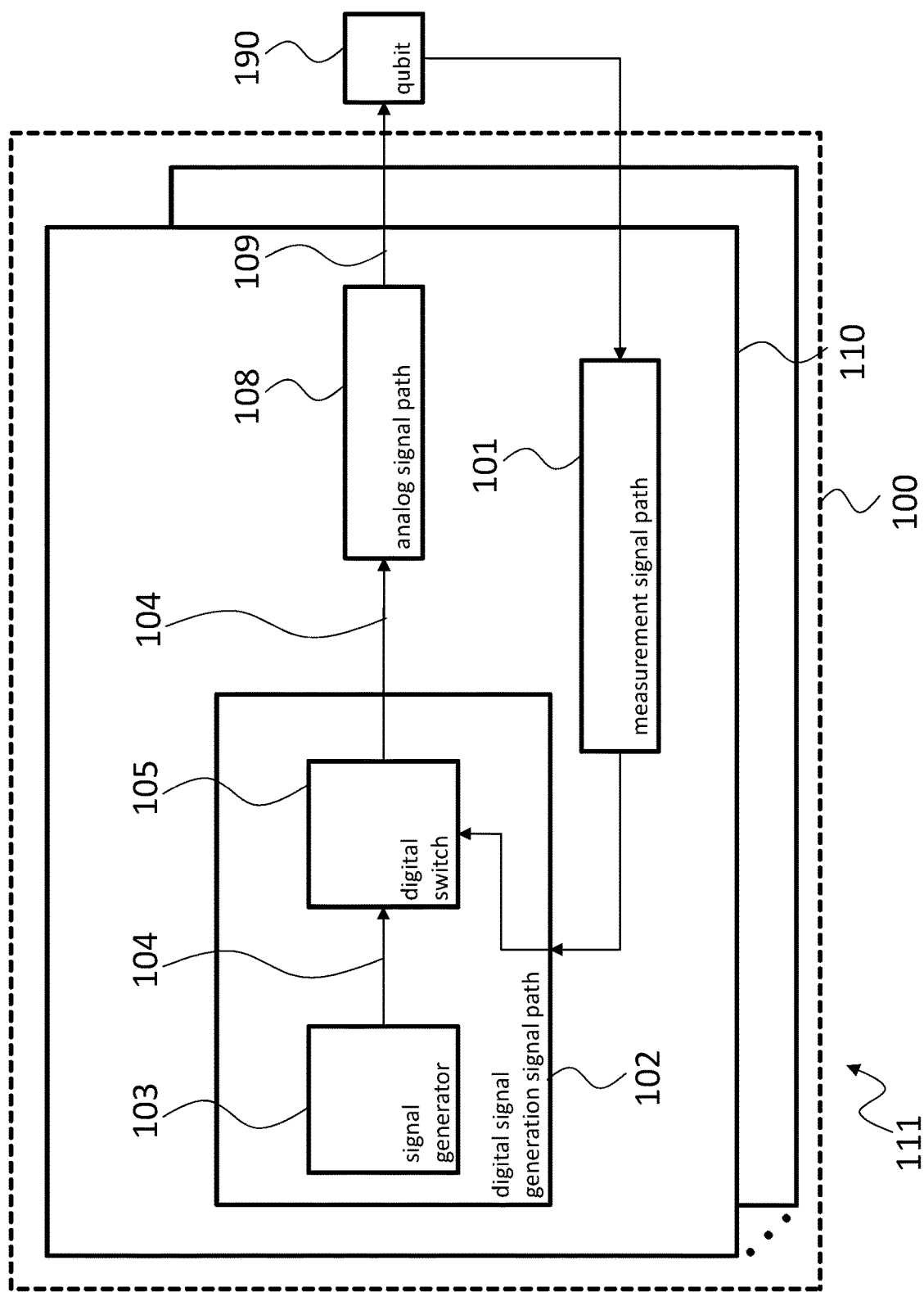
FIG. 1 shows a block diagram of an embodiment of a control system according to the present disclosure.

FIG. 1 shows a block diagram of a control system 100 that is provided in a quantum computer system 111 together with a respective qubit 190. It is understood, that while only one qubit 190 with one control system 100 is shown, the quantum computer system 111 may comprise multiple qubits coupled to a single control system, and multiple control systems for a plurality of qubits.

The control system 100 comprises a single qubit control channel 110 with a measurement signal path 101 that is coupled to the qubit 190 for measuring a state of the qubit 190. Further qubit control channels may be provided as hinted at in FIG. 1. The measurement signal path 101 is further coupled to a digital signal generation signal path 102 to indicate the state of the qubit 190 to the digital signal generation signal path 102. The measurement signal path 101 may e.g., provide the raw measurement result to the digital signal generation signal path 102 for further processing or may provide a signal that is derived from the raw measurement result and indicates the measured state to the qubit 190.

The digital signal generation signal path 102 comprises a signal generator 103 and a digital switch 105, wherein the signal generator 103 provides a digital control signal 104 to the digital switch 105, and the digital switch 105 will either block or forward the digital control signal 104 depending on the measured state of the qubit 190.

During operation of the quantum computer system 111, the signal generator 103 will generate one or multiple sequential digital control signals 104 that are then provided to the digital switch 105. The digital switch 105 will then pass through the respective digital control signal 104 to the analog signal path 108 or block the respective digital control signal 104 based on the measured state of the qubit 190. In embodiments, the measurement result may be provided directly as control signal for the digital switch 105. In other embodiments, a respective evaluation circuitry or evaluation unit may be provided to evaluate the measurement signal and control the digital switch 105 accordingly, as will be shown below.

The output of the digital switch 105 is coupled to the analog signal path 108, and the analog signal path 108 is coupled to the qubit 190. The analog signal path 108 will convert the digital control signal 104 received from the digital switch 105 into an analog control pulse waveform 109 for controlling the qubit 190. Although not shown in detail, it is understood, that the analog signal path 108 may comprise any combination of analog and digital circuitry that is required to control the qubit 190 accordingly. It is understood, that the specific implementation of such circuitry depends on the specific implementation of the qubit 190.

Figure 2:
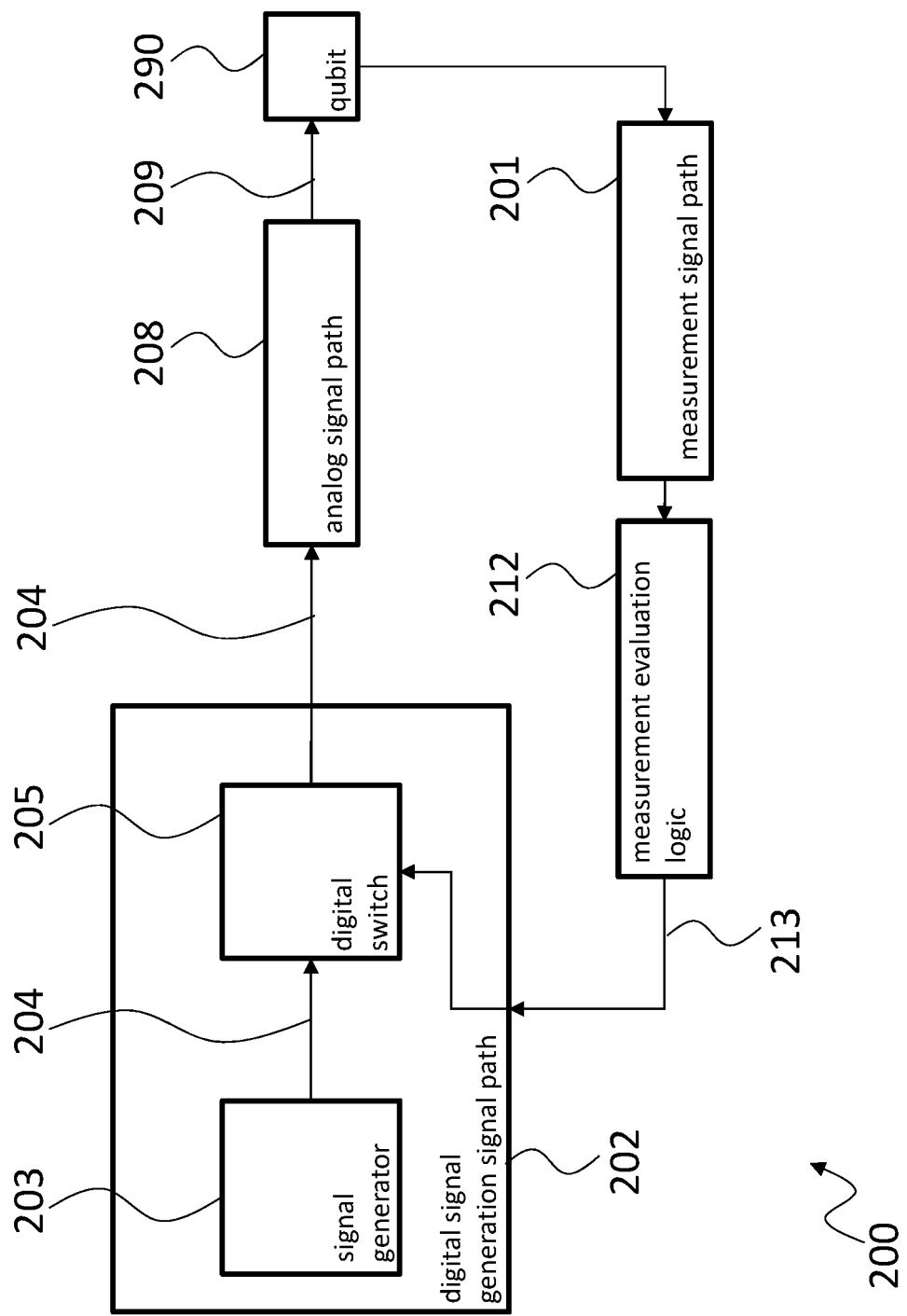
FIG. 2 shows a block diagram of another embodiment of a control system according to the present disclosure.

FIG. 2 shows a block diagram of a control system 200. The control system 200 is based on the control system 100. Consequently, the control system 200 comprises a measurement signal path 201 that is coupled to the qubit 290 for measuring the state of the qubit 290. The control system 200 further comprises a digital signal generation signal path 202.

The digital signal generation signal path 202 comprises a signal generator 203 and a digital switch 205. The output of the digital switch 205 is coupled to an analog signal path 208, and the analog signal path 208 is coupled to the qubit 290. The explanations provided above for the control system 100 apply mutatis mutandis to the control system 200.

The control system 200 further comprises a measurement evaluation logic 212 that is provided between the measurement signal path 201 and the digital signal generation signal path 202 and generates a switch control signal 213 based on a measurement result provided by the measurement signal path 201.

The measurement evaluation logic 212 may evaluate the measurement result provided by the measurement signal path 201 and determine if the digital switch 205 should pass through a respective switch control signal 204 or not, and generate a respective switch control signal 213. It is understood, that the switch control signal 213 may be a discrete signal that directly controls the digital switch 205, or any other kind of signal that may be processed to control the digital switch 205.

In embodiments, the measurement evaluation logic 212 may also be provided in the digital signal generation signal path 202 or may be integrated into the measurement signal path 201 or any other adequate element of the control system 200.

The measurement evaluation logic 212 may comprise or may be provided in or as part of at least one of a dedicated processing element e.g., a processing unit, a microcontroller, a field programmable gate array, FPGA, a complex programmable logic device, CPLD, an application specific integrated circuit, ASIC, or the like. A respective program or configuration may be provided to implement the required functionality. The measurement evaluation logic 212 may at least in part also be provided as a computer program product comprising computer readable instructions that may be executed by a processing element. In a further embodiment, the measurement evaluation logic 212 may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them.

In addition, it is understood, that any required supporting or additional hardware may be provided like e.g., a power supply circuitry and clock generation circuitry.

Figure 3:
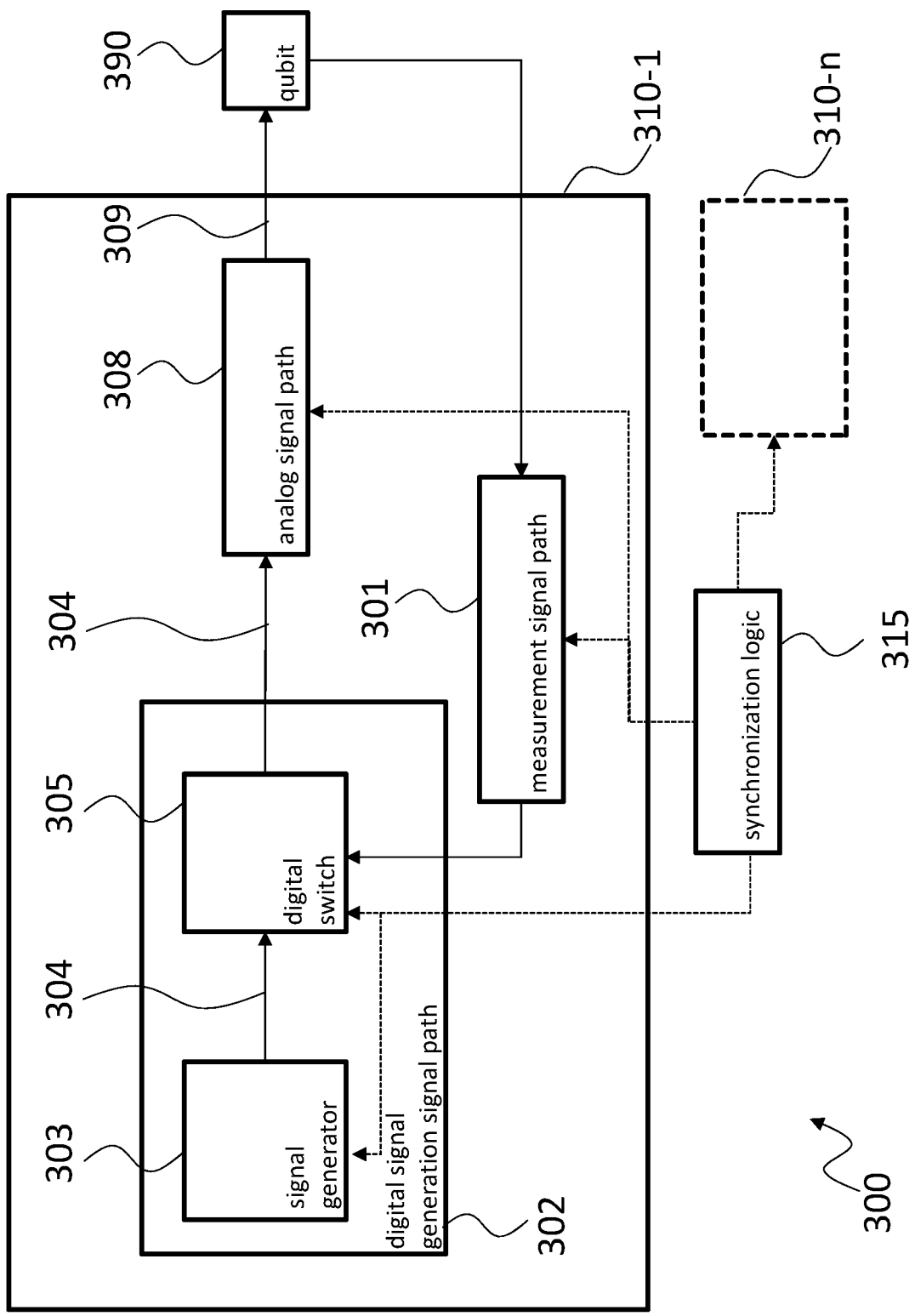
FIG. 3 shows a block diagram of another embodiment of a control system according to the present disclosure.

FIG. 3 shows a block diagram of a control system 300. The control system 300 is based on the control system 100. Consequently, the control system 300 comprises a qubit control channel 310-1 with a measurement signal path 301 that is coupled to the qubit 390 for measuring the state of the qubit 390. The measurement signal path 301 is further coupled to a digital signal generation signal path 302 to indicate the state of the qubit 390 to the digital signal generation signal path 302. The digital signal generation signal path 302 comprises a signal generator 303 and a digital switch 305. The output of the digital switch 305 is coupled to an analog signal path 308, and the analog signal path 308 is coupled to the qubit 390. The explanations provided above for the control system 100 and the control system 200 apply mutatis mutandis to the control system 300.

The control system 300 further comprises a synchronization logic 315 that is coupled to the qubit control channel 310-1. The control system 300 may optionally comprise further qubit control channels 310-$n$ that may also be coupled to the synchronization logic 315.

The synchronization logic 315 in the control system 300 is coupled to the measurement signal path 301, the signal generator 303, the digital switch 305, and the analog signal path 308 of the control system 300. It is understood, that in other embodiments, the synchronization logic 315 may be coupled only to some of the elements of the qubit control channel 310-1, or to further elements, that are not present in the qubit control channel 310-1. The same applies to the connection of the synchronization logic 315 to the further possible qubit control channels 310-$n$.

The synchronization logic 315 serves to synchronize the operation of different elements in the control system 300. Of course, if a quantum computer system comprises multiple control systems, the synchronization logic 315 may synchronize all or at least some of the control systems.

The synchronization logic 315 may e.g., synchronize the measurement signal path 301 with the signal generator 303 such that the measurement result is available at the digital switch 305 exactly when the digital control signal 304 also is available at the digital switch 305.

The synchronization logic 315 may comprise at least one of analog and digital elements for performing the synchronization and may generate respective trigger signals for the single elements of the control system 300.

The synchronization logic 315 may comprise or may be provided in or as part of at least one of a dedicated processing element e.g., a processing unit, a microcontroller, a field programmable gate array, FPGA, a complex programmable logic device, CPLD, an application specific integrated circuit, ASIC, or the like. A respective program or configuration may be provided to implement the required functionality. The synchronization logic 315 may at least in part also be provided as a computer program product comprising computer readable instructions that may be executed by a processing element. In a further embodiment, the synchronization logic 315 may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them.

In addition, it is understood, that any required supporting or additional hardware may be provided like e.g., a power supply circuitry and clock generation circuitry.

Figure 4:
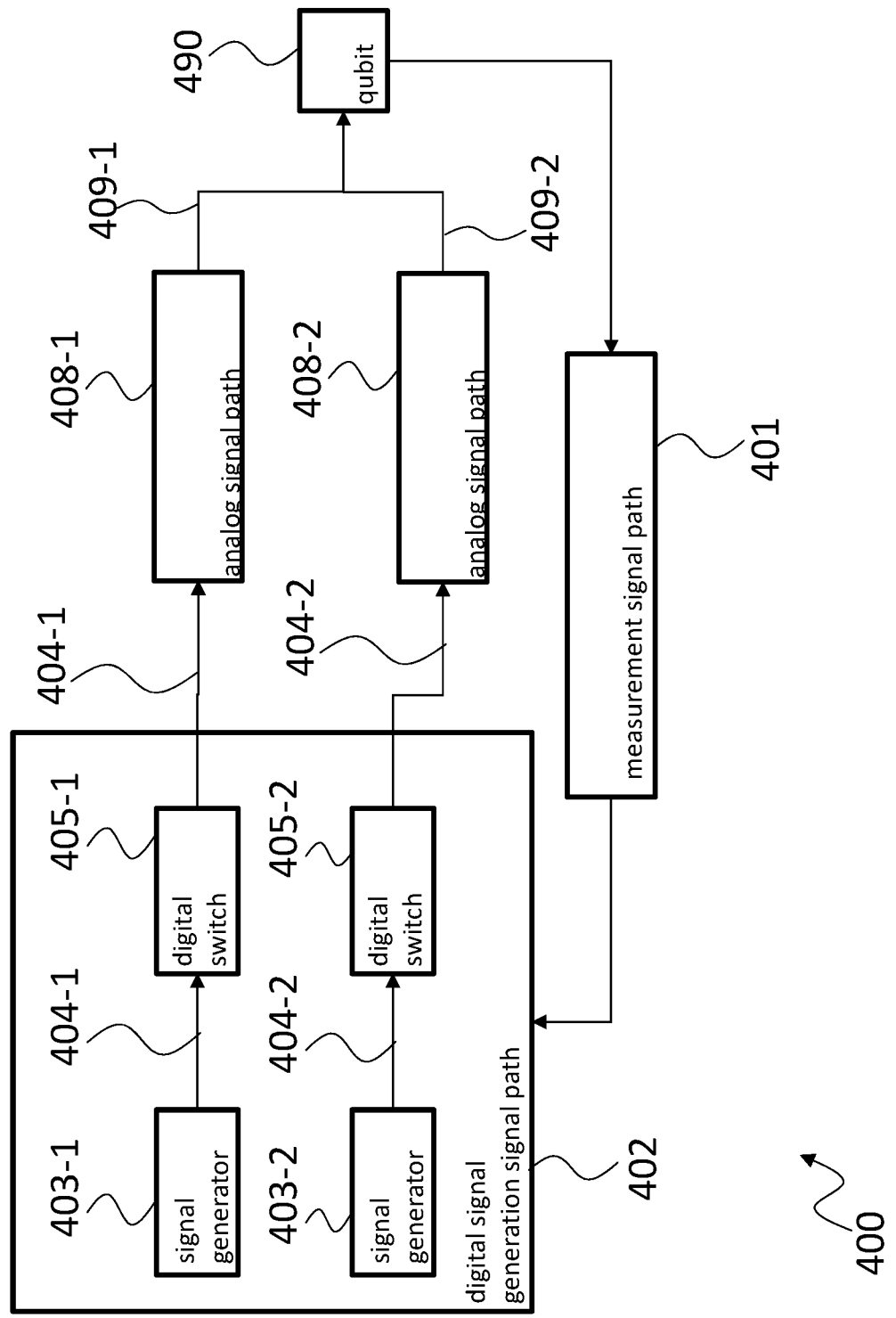
FIG. 4 shows a block diagram of another embodiment of a control system according to the present disclosure.

FIG. 4 shows a block diagram of a control system 400. The control system 400 is based on the control system 100. The control system 400 comprises a qubit control channel (not separately referenced) with a measurement signal path 401 that is coupled to the qubit 490 for measuring the state of the qubit 490. The measurement signal path 401 is further coupled to a digital signal generation signal path 402 to indicate the state of the qubit 490 to the digital signal generation signal path 402. The explanations provided above for the control system 100, the control system 200, and the control system 300 apply mutatis mutandis to the control system 400, wherein single features of any of the embodiments of the control system 100, the control system 200, the control system 300, and the control system 400 may be combined as required to form new embodiments.

In contrast to the digital signal generation signal path 102, the digital signal generation signal path 402 comprises two parallel signal paths, each comprising a signal generator 403-1, 403-2 and a digital switch 405-1, 405-2. The output of the digital switch 405-1, 405-2 is in each case coupled to an analog signal path 408-1, 408-2, and the analog signal paths 408-1, 408-2 are coupled to the qubit 490 to each provide an analog control pulse waveform 409-1, 409-2.

The output signals from both analog signal paths 408-1, 408-2 are combined into a single control signal for the qubit 490. Although not shown, respective analog mixing circuitry may be provided.

With the control system 400, it is possible to generated a dedicated analog control pulse waveform 409-1, 409-2 in each one of the analog signal paths 408-1, 408-2 based on the measurement result provided by the measurement signal path 401.

In embodiments, dedicated circuitry, like FPGAs and CPLDs may be developed to include the elements of the digital signal generation signal path 402. However, the arrangement of the control system 400 also allows using standard components, like available DACs. A possible embodiment for a single signal path using DAC elements is shown below in FIG. 5.

Figure 5:
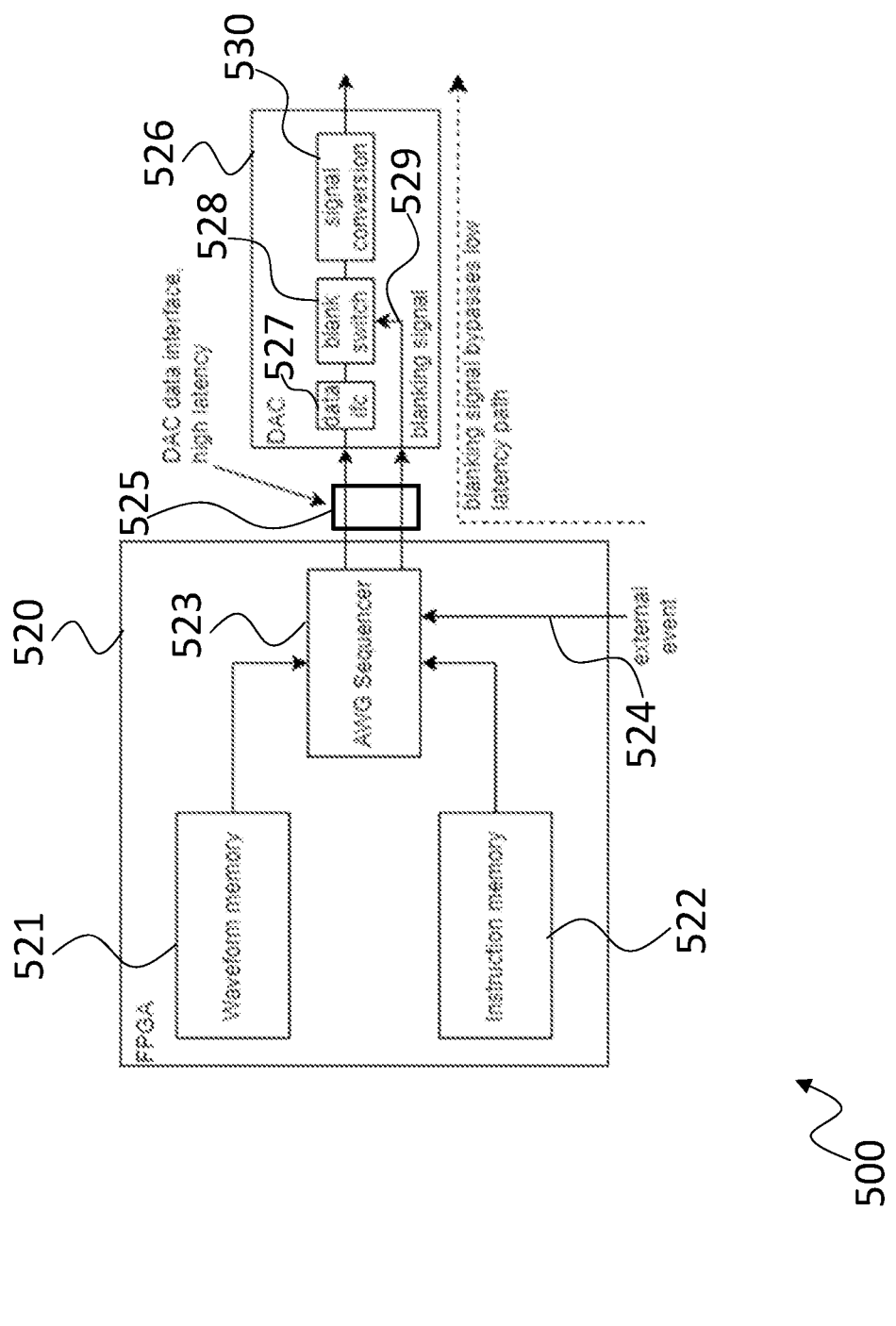
FIG. 5 shows a block diagram of another embodiment of a control system according to the present disclosure.

FIG. 5 shows a block diagram of a control system 500. The control system 500 comprises an FPGA 520 that may implement at least part of the digital signal generation signal path of the control system. The FPGA 520 is coupled via a DAC interface 525 e.g., a JESD204B or JESD204C interface, to a digital-to-analog converter, DAC 526. The DAC 526 may comprise another part or section of the digital signal generation signal path, and at least part of the analog signal path of the control system.

The FPGA 520 comprises a waveform memory 521 and an instruction memory 522 that are both coupled to an AWG sequencer 523. The AWG sequencer 523 may be seen as the sequencer of the digital section of an arbitrary waveform generator that is implemented in the FPGA 520 by the waveform memory 521, and the instruction memory 522 together with the AWG sequencer 523. The AWG sequencer 523 may be used to generate the digital control signal and for providing the digital control signal to the DAC 526.

In the context of the FPGA 520, the term "comprises" refers to at least one of the FPGA either being provided with a respective configuration or comprising a respective hardware element. Of course, the FPGA may also comprise a respective interface to couple to the DAC 526.

The DAC 526 comprises a data interface 527 that receives the data from the AWG sequencer 523. The data is then forwarded from the data interface 527 to the digital switch 528 that may pass through the digital control signal or to block the digital control signal. The digital control signals that are passed through by the digital switch 528 are then processed by the conversion circuitry 530 that converts the digital control signals into analog control pulse waveforms for the qubit that is to be controlled.

The elements of the control system 500 from the waveform memory 521, and the instruction memory 522 to the digital switch 528 may be seen as the digital signal generation signal path of the control system 500. The elements of the conversion circuitry 530 and any optional analog circuitry that may be provided between the conversion circuitry 530 and the qubit to be controlled may be seen as the analog signal path of the control system 500.

In the control system 500, an external event signal 524 is provided to the AWG sequencer 523. The AWG sequencer 523 uses that external event signal 524 to determine if a control signal 529 or what type of control signal 529 is to be transmitted to the digital switch 528.

The external event signal 524 may e.g., be the measurement signal provided by a (not shown) measurement signal path, or a signal that is based on the measurement signal. The section of the AWG sequencer 523 that analyzes or processes the external event signal 524 may also be seen as part of, or as implementation of the measurement evaluation logic shown in FIG. 2. In embodiments, the external event signal 524 may be a signal that is directly provided to the switch 528.

Figure 6:
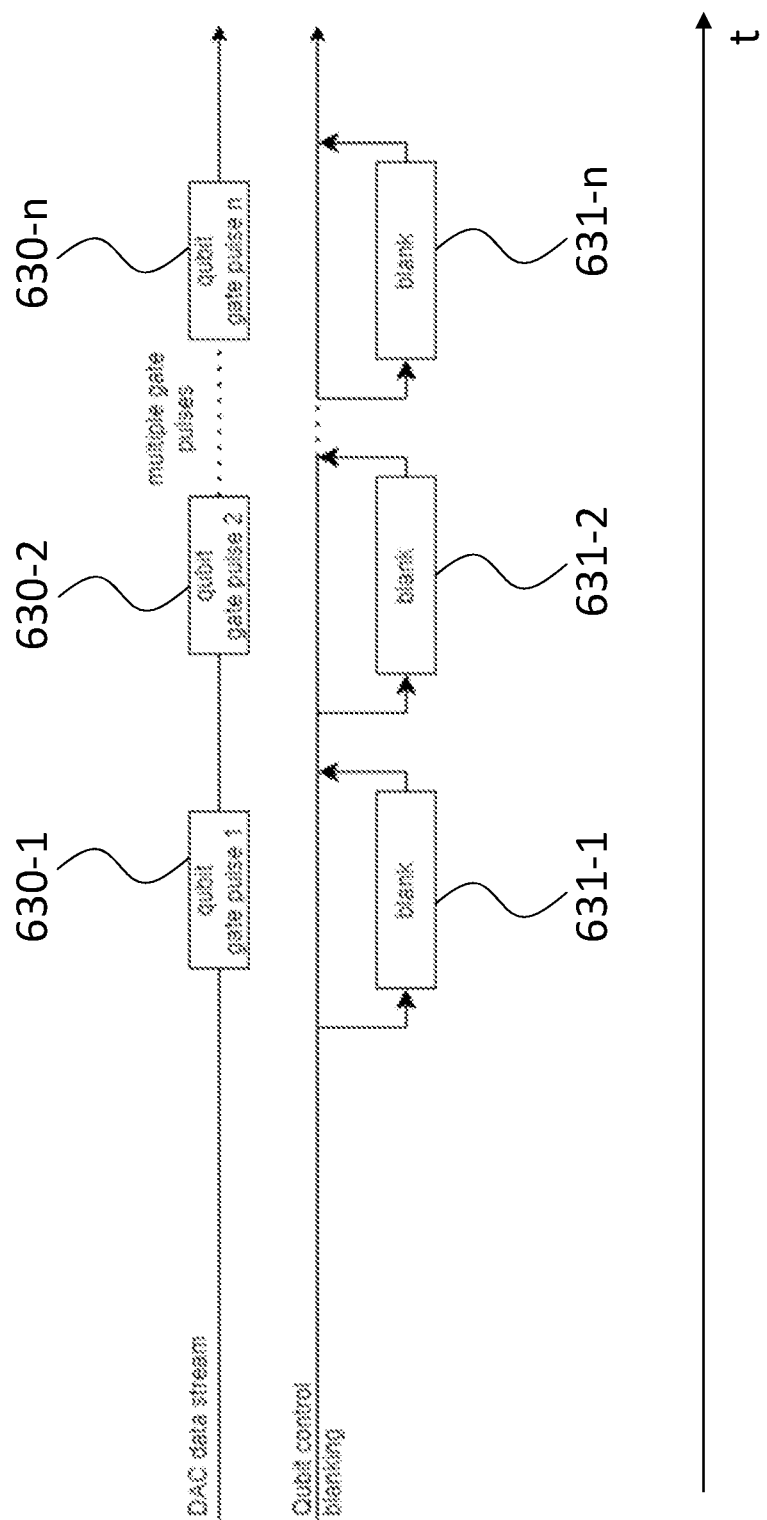
FIG. 6 shows a diagram of possible signals in an embodiment of a control system according to the present disclosure.

FIG. 6 shows a diagram of possible signals in any of the possible embodiments of a control system disclosed herein. The signal denominated "DAC data stream" shows a sequence of gate pulses 630-1-630-$n$, wherein each one of the gate pulses 630-1-630-$n$ may be seen as an implementation of a digital control signal according to the present disclosure. The second signal denominated "qubit control blanking" comprises control signals 631-1-631-$n$ for controlling a digital switch in a control system.

In FIG. 6 it can be seen that a timely aligned blanking or control signal 631-1-631-$n$ may be provided for each one of a sequence of gate pulses 630-1-630-$n$, and that with the control signals 631-1-631-$n$ single gate pulses 630-1-630-$n$ may be blanked out or passed through to the respective qubit.

It is understood, that although a blanking control signal 631-1-631-$n$ is shown for every one of the gate pulses 630-1-630-$n$, blanking control signals not necessarily need to be provided for all gate pulses 630-1-630-$n$.

In an exemplary embodiment, the first gate pulse 630-1 may comprise a gate pulse that initiates the qubit to transition from the |f> state to the |e> state. the second gate pulse 630-2 may comprise a gate pulse that initiates the qubit to transition from the |e> state to the |g> state. Any other gate pulse may be part of a quantum algorithm that is executed after resetting a qubit.

Depending on the measured state of the qubit, the first, the first and the second or no one of the gate pulses 630-1-630-$n$ may be blanked out, as explained above.

Figure 7:
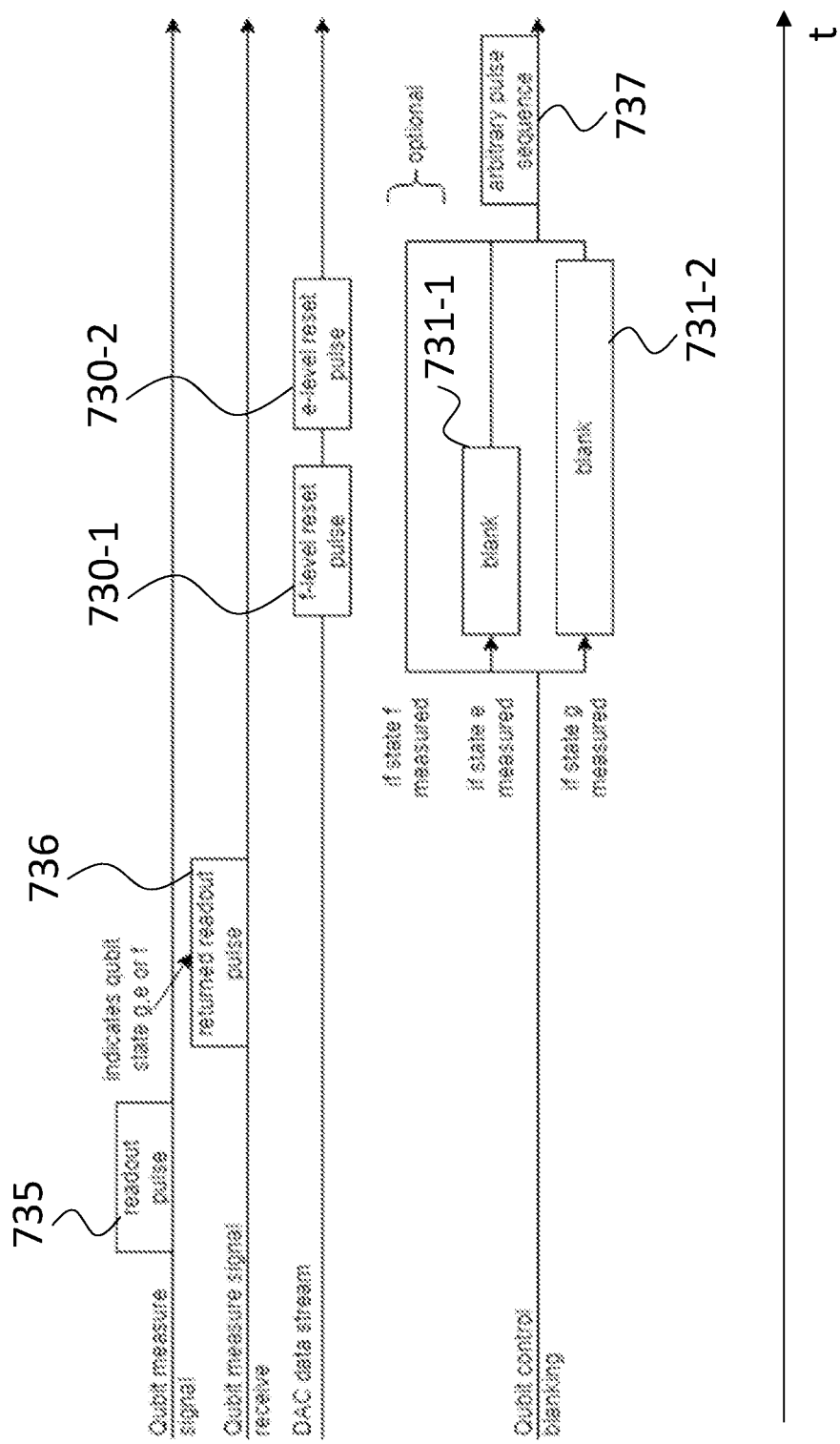
FIG. 7 shows another diagram of possible signals in an embodiment of a control system according to the present disclosure.

FIG. 7 shows a diagram of possible signals in any of the possible embodiments of a control system disclosed herein. The signal denominated "DAC data stream" shows a sequence of gate pulses 730-1, 730-2. The signal denominated "qubit control blanking" comprises control signals 731-1, 731-2 for controlling a digital switch in a control system, wherein an arbitrary (algorithm dependent) set of control signals 737 may be provided after the control signals 731-1, 731-2.

The signal denominated "qubit measure signal" refers to a probe pulse 735 that is sent to the respective qubit, while the signal denominated "qubit measure signal receive" refers to the measurement signal 736 received from the qubit as response to the probe pulse 735.

In a control system according to the present disclosure, the generation of any required gate pulses 730-1, 730-2 may be initiated already before the measurement signal 736 is evaluated, such that the gate pulses 730-1, 730-2 are available as early as possible, but not earlier than any possibly required control signals 731-1, 731-2 for blanking out a respective gate pulse 730-1, 730-2.

In the shown example, the gate pulse 730-1 initiates the qubit to transition from the |f> state to the |e> state, and the gate pulse 730-2 initiates the qubit to transition from the |e> state to the |g> state.

In contrast to the control signals 631-1-631-$n$ in FIG. 6, in FIG. 7 three possible variants are shown in parallel, a control signal that comprises no instruction to the digital switch to block any control signal, a control signal 731-1 that blocks only the first gate pulse 730-1, and a control signal 731-2 that blocks the first and the second gate pulses 730-1, 730-2.

Depending on the state of the qubit that results from the measurement signal 736, the correct control signal 731-1, 731-2 or none may be selected.

Figure 8:
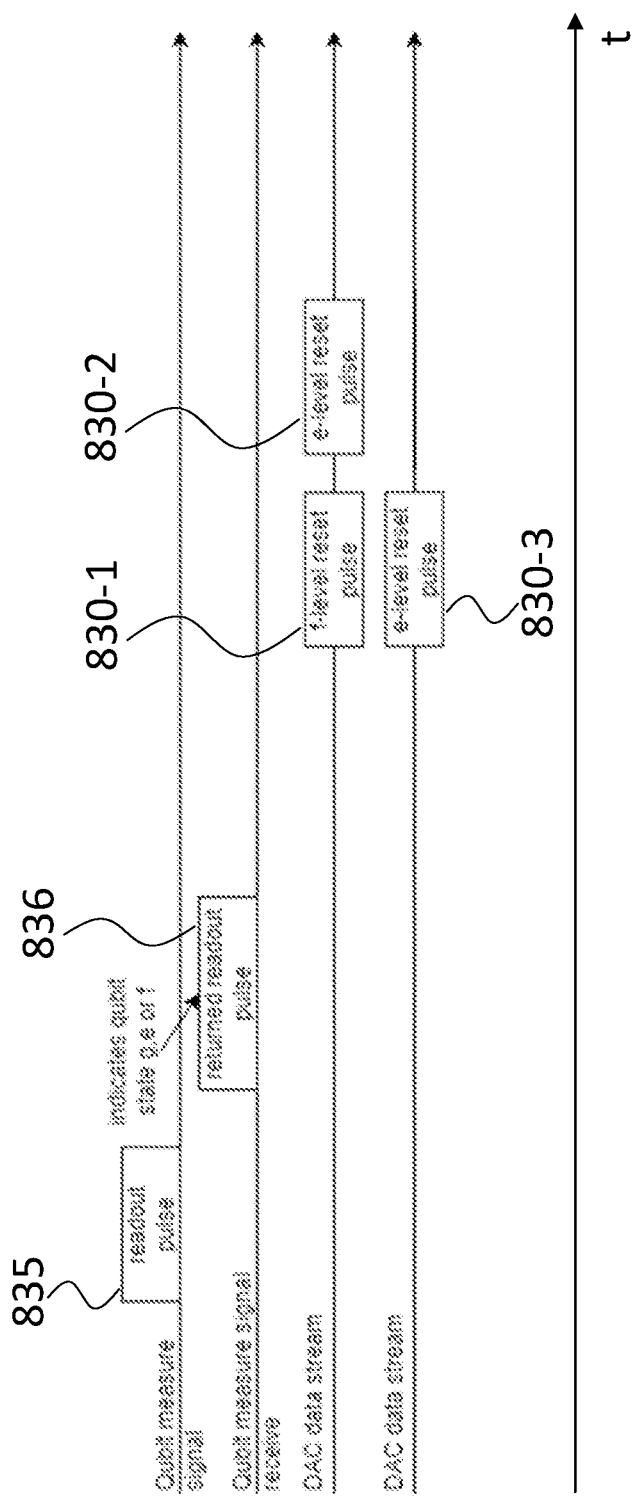
FIG. 8 shows another diagram of possible signals in an embodiment of a control system according to the present disclosure.

FIG. 8 shows another diagram of possible signals in any of the possible embodiments of a control system disclosed herein. The two signals denominated "DAC data stream" show a sequence of gate pulses 830-1, 830-2, or a single gate pulse 830-3. The signal denominated "qubit measure signal" refers to a probe pulse 835 that is sent to the respective qubit, while the signal denominated "qubit measure signal receive" refers to the measurement signal 836 received from the qubit as response to the probe pulse 835.

The embodiment of the gate pulses 830-1, 830-2, and 830-3 shown in FIG. 8, in contrast to the gate pulses shown in FIG. 7, allows further speeding up the reset procedure for a qubit, since only the required gate pulses 830-1, 830-2, and 830-3 will be applied to the qubit and other pulses regarding a respective algorithm may be applied early.

If for example, the qubit is in the |f> state, a blanking control signal may be provided to blank out gate pulse 830-3. If for example, the qubit is in the |e> state, a blanking control signal may be provided to blank out gate pulses 830-1, and 830-2. In this case, only the gate pulse 830-3 is applied to the qubit, and the first gate pulse of a respective algorithm may be applied instead of gate pulse 830-2 directly after the gate pulse 830-3.

Figure 9:
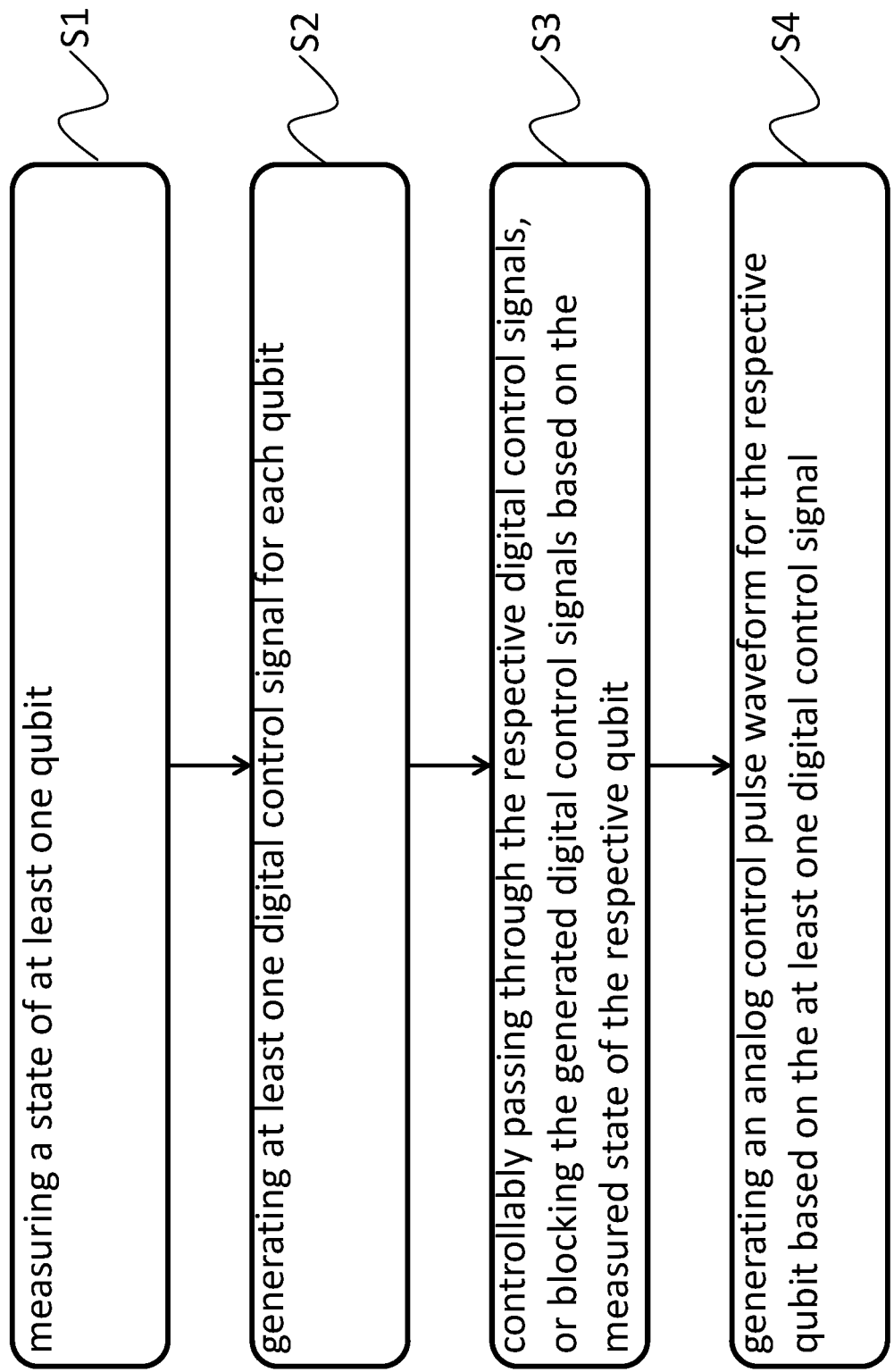
FIG. 9 shows a flow diagram of an embodiment of a control method according to the present disclosure.

FIG. 9 shows a flow diagram of a control method for controlling at least one qubit.

The control method comprises measuring S1 a state of the at least one qubit. Further, the control method comprises generating S2 at least one digital control signal for each qubit. In addition, the control method comprises controllably passing S3 through the respective digital control signals, or blocking the generated digital control signals based on the measured state of the respective qubit. The control method further comprises generating S4 an analog control pulse waveform for the respective qubit based on the at least one digital control signal when it is passed and not blocked in step S3.

The control method may further comprise evaluating the measurement results, and generating respective switch control signals, and providing the generated switch control signals to respective switches for controllably passing through or blocking the generated digital control signals.

In an embodiment, the control method may further comprise synchronizing the measuring S1, the generating S2 at least one digital control signal, the controllably S3 passing through or blocking the generated digital control signals, and the generating S4 an analog control pulse waveform.

Generating S2 at least one digital control signal may comprise generating at least two digital control signals, wherein the at least two digital control signals are generated at least one of sequentially or in parallel. More than two digital control signals may be generated, wherein some of the digital control signals may be generated sequentially, while other digital control signals may be generated in parallel.

Each digital control signal may be generated based on the output of a respective digital data stream source, and each digital data stream source may output the respective digital control signal directly, or via a serial data interface, or via a parallel data interface for then controllably passing through or blocking the respective digital signal. All passed-through digital control signals may then be converted into respective analog control pulse waveforms for the respective qubit.

Each digital data stream source may comprise an arbitrary waveform generator sequencer, wherein passing through or blocking and converting may be performed in a digital-to-analog converter.

In embodiments, at least two digital control signals for the same qubit may be provided each to a dedicated digital-to-analog converter, and wherein the control pulse waveforms from the dedicated digital-to-analog converters are combined and the combined control pulse waveform is provided to the respective qubit.

The at least one digital control signal comprises at least one of a digital control signal for a control pulse waveform that transitions the qubit from the |e> state to the |g> state, a digital control signal for a control pulse waveform that transitions the qubit from the |f> state to the |e> state, a digital control signal for a control pulse waveform that performs the function of an X gate on the qubit, a digital control signal for a control pulse waveform that performs the function of a Y gate on the qubit, a digital control signal for a control pulse waveform that performs the function of a Z gate on the qubit, a digital control signal for a control pulse waveform that performs the function of a CZ gate on the qubit, a digital control signal for a control pulse waveform that performs the function of an H gate on the qubit, a digital control signal for a control pulse waveform that performs the function of a CNOT gate on the qubit, a digital control signal for a control pulse waveform that performs the function of an S gate on the qubit, and a digital control signal for a control pulse waveform that performs the function of a T gate on the qubit.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

LIST OF REFERENCE SIGNS 100, 200, 300, 400, 500 control system
101, 201, 301, 401 measurement signal path
102, 202, 302, 402 digital signal generation signal path
103, 203, 303, 403-1, 403-2 signal generator
104, 204, 304, 404-1, 404-2 digital control signal
105, 205, 305, 405-1, 405-2 digital switch
108, 208, 308, 408-1, 408-2 analog signal path
109, 209, 309, 409-1, 409-2 analog control pulse waveform
110, 310-1, 310-$n$ qubit control channel
111 quantum computer system
212 measurement evaluation logic
213 switch control signal
315 synchronization logic
520 FPGA
521 waveform memory
522 instruction memory
523 AWG sequencer
524 event signal
525 DAC interface
526 digital-to-analog converter
527 data interface
528 digital switch
529 control signal
530 conversion circuitry
630-1-630-$n$, 730-1, 730-2 gate pulse
830-1, 830-2, 830-3 gate pulse
631-1-631-$n$, 731-1, 731-2 control signal
735, 835 probe pulse
736, 836 measurement signal
737 control signal sequence
190, 290, 390, 490 qubit
S1, S2, S3, S4 method steps

The invention claimed is:

1. A control system comprising:
at least one measurement signal path configured to measure a state of at least one respective qubit;
a digital signal generation signal path for each qubit, wherein the signal generation signal path is configured to generate at least one digital control signal for the respective qubit;
in each digital signal generation signal path, a digital switch for each digital control signal, wherein the digital switch is configured to controllably pass through the respective digital control signal to an output of the digital signal generation signal path or to block the respective digital control signal based on the measured state of the respective qubit; and
an analog signal path for each digital signal generation signal path, wherein the analog signal path is coupled to the output of the respective digital signal generation signal path and configured to generate an analog control pulse waveform for the respective qubit based on the at least one digital control signal.

2. The control system according to claim 1, further comprising at least one measurement evaluation logic that is coupled to a respective one of the measurement signal paths, and that is configured to evaluate the measurement result, and to generate a respective switch control signal, and to provide the generated switch control signal to the switches of the respective digital signal generation signal path.

3. The control system according to claim 1, further comprising a synchronization logic configured to synchronize the operation of at least two of a respective measurement signal path, the respective digital signal generation signal path, and the respective analog signal.

4. The control system according to claim 1, wherein at least one digital signal generation signal path is configured to generate at least two digital control signals, wherein the at least two digital control signals are generated at least one of sequentially or in parallel.

5. The control system according to claim 1, wherein each digital signal generation signal path comprises a digital data stream source for each digital control signal, and wherein each digital data stream source is coupled to the respective digital switch directly, or via a serial data interface, or via a parallel data interface;
wherein outputs of all digital switches of each digital signal generation signal path are coupled to the respective analog signal path; and
wherein each analog signal path comprises converter circuitry configured to convert the received digital control signals into respective control pulse waveforms.

6. The control system according to claim 5, wherein each digital signal generation signal path comprises an arbitrary waveform generator sequencer as a digital data stream source that is coupled to the digital input interface of a respective digital-to-analog converter; and
wherein the respective digital switch and the converter circuitry are provided in the digital-to-analog converter, and wherein the digital switch is provided between the digital input interface and the converter circuitry.

7. The control system according to claim 5, further comprising in at least one of the digital signal generation signal paths at least two digital data stream sources, each with a respective switch, and a respective converter circuitry.

8. The control system according to claim 1, wherein the at least one digital control signal comprises at least one of:
a digital control signal for a control pulse waveform that transitions the qubit from the |e> state to the |g> state;
a digital control signal for a control pulse waveform that transitions the qubit from the |f> state to the |e> state;
a digital control signal for a control pulse waveform that performs the function of an X gate on the qubit;
a digital control signal for a control pulse waveform that performs the function of a Y gate on the qubit;
a digital control signal for a control pulse waveform that performs the function of a Z gate on the qubit;
a digital control signal for a control pulse waveform that performs the function of a CZ gate on the qubit;
a digital control signal for a control pulse waveform that performs the function of an H gate on the qubit;
a digital control signal for a control pulse waveform that performs the function of a CNOT gate on the qubit;
a digital control signal for a control pulse waveform that performs the function of an S gate on the qubit; and
a digital control signal for a control pulse waveform that performs the function of a T gate on the qubit.

9. A control method comprising:
measuring a state of at least one qubit;
generating at least one digital control signal for each qubit;
controllably passing through the respective digital control signals, or blocking the generated digital control signals based on the measured state of the respective qubit; and
generating an analog control pulse waveform for the respective qubit based on the at least one digital control signal.

10. The control method according to claim 9, further comprising evaluating the measurement results, and generating respective switch control signals, and providing the generated switch control signals to respective switches for controllably passing through or blocking the generated digital control signals.

11. The control method according to claim 9, further comprising synchronizing the measuring, the generating at least one digital control signal, the controllably passing through or blocking the generated digital control signals, and the generating an analog control pulse waveform.

12. The control method according to claim 9, wherein generating at least one digital control signal comprises generating at least two digital control signals, wherein the at least two digital control signals are generated at least one of sequentially or in parallel.

13. The control method according to claim 9, wherein each digital control signal is generated based on the output of a respective digital data stream source, and wherein each digital data stream source outputs the respective digital control signal directly, or via a serial data interface, or via a parallel data interface for controllably passing through or blocking;
wherein all passed-through digital control signals are converted into respective analog control pulse waveforms for the respective qubit.

14. The control method according to claim 13, wherein each digital data stream source comprises an arbitrary waveform generator sequencer; and
wherein passing through or blocking and converting is performed in a digital-to-analog converter.

15. The control method according to claim 13, wherein at least two digital control signals for the same qubit are provided each to a dedicated digital-to-analog converter, and wherein the control pulse waveforms from the dedicated digital-to-analog converters are combined and the combined control pulse waveform is provided to the respective qubit.

16. The control method according to claim 9, wherein the at least one digital control signal comprises at least one of:
a digital control signal for a control pulse waveform that transitions the qubit from the |e> state to the |g> state;
a digital control signal for a control pulse waveform that transitions the qubit from the |f> state to the |e> state;
a digital control signal for a control pulse waveform that performs the function of an X gate on the qubit;
a digital control signal for a control pulse waveform that performs the function of a Y gate on the qubit;
a digital control signal for a control pulse waveform that performs the function of a Z gate on the qubit;
a digital control signal for a control pulse waveform that performs the function of a CZ gate on the qubit;
a digital control signal for a control pulse waveform that performs the function of an H gate on the qubit;
a digital control signal for a control pulse waveform that performs the function of a CNOT gate on the qubit;
a digital control signal for a control pulse waveform that performs the function of an S gate on the qubit; and
a digital control signal for a control pulse waveform that performs the function of a T gate on the qubit.

17. A quantum computer system comprising:
at least one qubit; and
a control system comprising:
a measurement signal path for at least one of the qubits configured to measure a state of the respective qubit;

a digital signal generation signal path for each qubit, wherein the signal generation signal path is configured to generate at least one digital control signal for the respective qubit;

in each digital signal generation signal path, a digital switch for each digital control signal, wherein the digital switch is configured to controllably pass through the respective digital control signal to an output of the digital signal generation signal path or to block the respective digital control signal based on the measured state of the respective qubit; and an analog signal path for each digital signal generation signal path, wherein the analog signal path is coupled to the output of the respective digital signal generation signal path and configured to generate an analog control pulse waveform for the respective qubit based on the at least one digital control signal.

18. The quantum computer system according to claim 17, further comprising at least one measurement evaluation logic that is coupled to a respective one of the measurement signal paths, and that is configured to evaluate the measurement result, and generate a respective switch control signal, and provide the generated switch control signal to the switches of the respective digital signal generation signal path.

19. The quantum computer system according to claim 17, further comprising a synchronization logic configured to synchronize the operation of at least two of a respective measurement signal path, the respective digital signal generation signal path, and the respective analog signal.

20. The quantum computer system according to claim 17, wherein at least one digital signal generation signal path is configured to generate at least two digital control signals, wherein the at least two digital control signals are generated at least one of sequentially or in parallel.

21. The quantum computer system according to claim 17, wherein at least one of the digital signal generation signal paths comprises a digital data stream source for each digital control signal, and wherein each digital data stream source is coupled to the respective digital switch directly, or via a serial data interface, or via a parallel data interface;

wherein outputs of all digital switches of each digital signal generation signal path are coupled to the respective analog signal path; and wherein each analog signal path comprises converter circuitry configured to convert the received digital control signals into respective control pulse waveforms.

22. The quantum computer system according to claim 21, wherein each digital signal generation signal path comprises an arbitrary waveform generator sequencer as digital data stream source that is coupled to the digital input interface of a respective digital-to-analog converter; and wherein the respective digital switch and the converter circuitry are provided in the digital-to-analog converter, and wherein the digital switch is provided between the digital input interface and the converter circuitry.

23. The quantum computer system according to claim 21, further comprising in at least one of the digital signal generation signal paths at least two digital data stream sources, each with a respective switch, and a respective converter circuitry.

24. The quantum computer system according to claim 17, wherein the at least one digital control signal comprises at least one of:

a digital control signal for a control pulse waveform that transitions the qubit from the |e> state to the |g> state;

a digital control signal for a control pulse waveform that transitions the qubit from the |f> state to the |e> state;

a digital control signal for a control pulse waveform that performs the function of an X gate on the qubit;

a digital control signal for a control pulse waveform that performs the function of a Y gate on the qubit;

a digital control signal for a control pulse waveform that performs the function of a Z gate on the qubit;

a digital control signal for a control pulse waveform that performs the function of a CZ gate on the qubit;

a digital control signal for a control pulse waveform that performs the function of an H gate on the qubit;

a digital control signal for a control pulse waveform that performs the function of a CNOT gate on the qubit;

a digital control signal for a control pulse waveform that performs the function of an S gate on the qubit; and a digital control signal for a control pulse waveform that performs the function of a T gate on the qubit.

* * * * *